United States Patent
Wu et al.

(10) Patent No.: US 11,521,771 B2
(45) Date of Patent: Dec. 6, 2022

(54) SYSTEM FOR QUENCH PROTECTION OF SUPERCONDUCTING MACHINES, SUCH AS A SUPERCONDUCTING WIND TURBINE GENERATOR

(71) Applicant: General Electric Company, Schenectady, NY (US)

(72) Inventors: Anbo Wu, Clifton Park, NY (US); Michael Parizh, Niskayuna, NY (US); Minfeng Xu, Ballston Lake, NY (US)

(73) Assignee: General Electric Company, Schenectady, NY (US)

(*) Notice: Subject to any disclaimer, the term of this patent is extended or adjusted under 35 U.S.C. 154(b) by 902 days.

(21) Appl. No.: 16/373,960

(22) Filed: Apr. 3, 2019

(65) Prior Publication Data

US 2020/0321152 A1 Oct. 8, 2020

(51) Int. Cl.
| | | |
|---|---|---|
| *H02H 7/00* | (2006.01) | |
| *H01F 6/02* | (2006.01) | |
| *H02K 11/20* | (2016.01) | |
| *H01F 6/06* | (2006.01) | |
| *H02K 7/18* | (2006.01) | |

(52) U.S. Cl.
CPC ............. *H01F 6/02* (2013.01); *H01F 6/06* (2013.01); *H02H 7/001* (2013.01); *H02K 11/20* (2016.01); *H02K 7/183* (2013.01)

(58) Field of Classification Search
CPC .......... H01F 6/02; H01H 7/001; H02K 55/00; H02H 7/001
See application file for complete search history.

(56) References Cited

U.S. PATENT DOCUMENTS

| | | |
|---|---|---|
| 904,607 A | 11/1908 | Elmblad |
| 5,627,709 A | 5/1997 | Salasoo |
| 5,731,939 A | 3/1998 | Gross et al. |
| 6,900,714 B1 | 5/2005 | Huang et al. |
| 6,924,565 B2 | 8/2005 | Wilkins et al. |
| 7,013,203 B2 | 3/2006 | Moore et al. |

(Continued)

FOREIGN PATENT DOCUMENTS

| | | | | |
|---|---|---|---|---|
| CN | 105513743 A | * | 4/2016 | ......... G01R 33/3815 |
| CN | 107 221 401 A | | 9/2017 | |

(Continued)

OTHER PUBLICATIONS

EPO Search Report, dated Jun. 29, 2020.
(Continued)

*Primary Examiner* — Ramon M Barrera
(74) *Attorney, Agent, or Firm* — Dority & Manning, P.A.

(57) ABSTRACT

A quench protection system for a superconducting machine, such as a superconducting generator having a plurality of series-arranged superconducting coils, includes at least one switch heater electrically coupled to each of the superconducting coils. A quench protection switch is provided in series with the coils, wherein each switch heater is in thermal contact with the quench protection switch. A heater network is configured in parallel with the quench protection switch and is in thermal contact with each of the coils. A quench of any one of the coils triggers a quench of the quench protection switch, wherein the heater network then triggers a quench of all of the remaining coils.

16 Claims, 4 Drawing Sheets

(56) References Cited

U.S. PATENT DOCUMENTS

| | | |
|---|---|---|
| 7,053,509 B2 | 5/2006 | Ryan et al. |
| 7,071,579 B2 | 7/2006 | Erdman et al. |
| 7,095,597 B1 | 8/2006 | Cousineau |
| 7,161,777 B2 | 1/2007 | Tsuchiya et al. |
| 7,166,928 B2 | 1/2007 | Larsen |
| 7,196,883 B2 | 3/2007 | Tsuchiya et al. |
| 7,245,037 B2 | 7/2007 | Angquist et al. |
| 7,342,757 B2 | 3/2008 | Huang et al. |
| 7,567,160 B2 | 7/2009 | Folts et al. |
| 7,630,179 B2 | 12/2009 | Umans |
| 7,724,483 B2 | 5/2010 | Bray et al. |
| 7,923,862 B2 | 4/2011 | Cardinal et al. |
| 8,482,369 B2 * | 7/2013 | Wang ............... H01F 6/02 335/216 |
| 8,583,201 B2 | 11/2013 | Wu et al. |
| 8,653,685 B2 | 2/2014 | Garcia |
| 8,664,800 B2 | 3/2014 | Galbraith et al. |
| 8,780,510 B2 | 7/2014 | Huang et al. |
| 8,847,562 B2 | 9/2014 | Agudo Araque |
| 8,914,086 B2 | 12/2014 | Wu et al. |
| 9,214,883 B2 | 12/2015 | Kim et al. |
| 9,236,742 B2 | 1/2016 | Garcia |
| 9,240,681 B2 | 1/2016 | Rajput-Ghoshal et al. |
| 9,366,233 B2 | 6/2016 | Bech et al. |
| 9,407,186 B2 | 8/2016 | Babazadeh et al. |
| 9,419,439 B2 | 8/2016 | Nielsen |
| 9,556,852 B2 | 1/2017 | Babazadeh et al. |
| 9,556,853 B2 | 1/2017 | Gupta et al. |
| 9,638,774 B2 | 5/2017 | Pourrahimi |
| 9,660,448 B2 | 5/2017 | Ellena et al. |
| 2006/0176132 A1 | 8/2006 | Atkins et al. |
| 2009/0103217 A1 | 4/2009 | Langtry et al. |
| 2009/0224550 A1 | 9/2009 | Bray et al. |
| 2012/0182012 A1 | 7/2012 | Lvovsky et al. |
| 2012/0286617 A1 | 11/2012 | Cullen et al. |
| 2014/0175887 A1 | 6/2014 | Shao et al. |
| 2014/0185165 A1 * | 7/2014 | Rajput-Ghoshal ..... H02H 7/001 361/19 |
| 2016/0187439 A1 | 6/2016 | Lvovsky et al. |
| 2016/0268940 A1 | 9/2016 | Achilles et al. |
| 2017/0025858 A1 | 1/2017 | Garcia et al. |
| 2017/0250018 A1 | 8/2017 | Xu et al. |

FOREIGN PATENT DOCUMENTS

| | | |
|---|---|---|
| GB | 2540623 A | 1/2017 |
| JP | H10336999 A | 12/1998 |
| JP | 2004172485 A | 6/2004 |
| JP | 3788702 B2 | 6/2006 |
| JP | 2015070118 A | 4/2015 |
| JP | 2015023191 A | 5/2015 |
| KR | 101460341 B1 | 11/2014 |
| KR | 101486753 B1 | 2/2015 |
| KR | 101497809 B1 | 3/2015 |
| WO | WO03098764 A1 | 11/2003 |
| WO | WO2014/044007 A1 | 3/2014 |
| WO | WO2016060957 A2 | 4/2016 |

OTHER PUBLICATIONS

Schultz, Protection of Superconducting Magnets, IEEE Transactions on Applied Superconductivity, vol. 12, Issue 1, Mar. 2002, pp. 1390-1395. (Abstract Only).

Guo et al., Quench Protection for the MICE Cooling Channel Coupling Magnet, IEEE Transactions on Applied Superconductivity, vol. 19, Issue 3, Jun. 2009, pp. 1360-1363. (Abstract Only).

* cited by examiner

SYSTEM FOR QUENCH PROTECTION OF SUPERCONDUCTING MACHINES, SUCH AS A SUPERCONDUCTING WIND TURBINE GENERATOR

FIELD

The present disclosure relates generally to superconducting machines, such as superconducting wind turbine generators, and more particularly to quench protection systems and methods for such machines.

BACKGROUND

Generally, superconducting generators are made by constructing the generator field coils (which typically carry a substantially direct current) of a superconducting material ("superconductor") instead of the usual copper material. Superconductors are typically lighter in weight and smaller in size (e.g., relative to current carrying capacity) than traditional conductors such as copper, and are also more efficient at conducting current (particularly at lower frequencies). Thus, the use of superconductors in power applications, such as wind turbine generators, provides benefits such as more efficient performance, lower generator weight, non-gearbox direct drive operation, and lower manufacturing and installation costs. Such benefits are particularly for offshore wind turbine applications.

Protection circuits are configured with the superconducting generators to protect the superconducting magnet from damage that could otherwise occur during a quench. A quench occurs when a superconductor reverts to a resistive state as the result of localized heating in one part of the superconductor. When this part ceases to be superconductive, and enters a resistive state, any current flowing through the resistive part will cause local (Joule) heating. This, in turn, causes the adjacent parts of the superconductor to quench, resulting in a larger resistive volume, in turn causing further heating. Thus, in a rapid cascading fashion, the superconductor enters a resistive state, with a potentially very large current still flowing.

Prior to the quench, the coils retain a large amount of stored energy, wherein after the quench, this energy will be dissipated in the resistive volume of the conductor. If the quench process is not adequately managed and the energy is dissipated in only confined areas (such as the initial quench site), such areas experience rapid and large temperature spikes, which can damage the coil areas at or near the location of the initial quench.

A well-known quench protection methodology is to spread the quench process to essentially the entire mass of the superconductor to avoid the localized heating and dissipate the stored energy over as much of the available superconductor as possible. With certain types of superconducting machines, such as MRI machines, this quench protection is achieved by deliberately initiating a quench on the remaining superconductor coils after the initial quench by applying a current to one or more heaters that are in thermal contact with each coil. For a group of the coils, the heaters are configured in series, with the series arrangement in parallel with the coils. Thus, when one of the coils quenches, a rapid voltage rise develops across that coil and also across the series-connected heaters. Thus, a current will then flow through the series-connected heaters. The temperature rise caused by the heaters will then initiate a quench in the coils attached to the heaters. Thus, by initiating quenches in all of the coils, the energy is dissipated relatively evenly across all of the coils.

The quench protection methodology discussed above is typically implemented by a cross-linked heater matrix, wherein for a magnet with N coils, a cross-linked N*N heater matrix is utilized. However, for a large superconducting generator, such as a direct-drive superconducting wind turbine generator having a relatively large number of poles (e.g. in excess of 30 poles, wherein each pole corresponds to a superconducting field coil), it would be very costly to implement an N*N heater matrix for quench protection.

Accordingly, the industry is in need of an improved quench protection system and method that reduces the complexity and cost of conventional heater matrixes for larger superconducting generators, such as direct drive wind turbine generators.

BRIEF DESCRIPTION

Aspects and advantages of the invention will be set forth in part in the following description, or may be obvious from the description, or may be learned through practice of the invention.

In accordance with aspects of the present disclosure, a quench protection system is provided for a superconducting machine having a plurality of superconducting coils arranged in series. At least one switch heater (e.g. a resistor or restive network) may be electrically coupled across each of the superconducting coils. A quench protection switch is provided in series with the superconducting coils, wherein each of the switch heaters is in thermal contact with the quench protection switch. A heater network may be configured in parallel with the quench protection switch and may also be in thermal contact with each of the superconducting coils. With this unique configuration, a quench of any one of the superconducting coils activates the switch heater coupled therewith, and the activated switch heater triggers a quench of the quench protection switch. This quench of the quench protection switch then activates the heater network to trigger a quench of all remaining superconducting coils.

The heater network may have various configurations. For example, in one embodiment, the heater network includes a plurality of heaters connected in parallel, with each superconducting coil in thermal contact with at least one of the heaters.

In another embodiment, the heater network may include a plurality of heaters connected in series, with each superconducting coil in thermal contact with at least one of the heaters.

In still another embodiment, the heater network may include a plurality of heaters connected in parallel and a plurality of heaters connected in series, with each superconducting coil in thermal contact with at least one of the heaters.

In yet another embodiment, the heater network may include a single heater, with each superconducting coil in thermal contact with the single heater.

It may be desired to include a voltage clamp device across the heater network to limit the voltage applied across the heaters.

It may also be desired to include a shielding coil applied to the quench protection switch to accelerate quenching of the heater network.

The present disclosure also encompasses a superconducting generator that includes a plurality of superconducting field coils and a quench protection system as discussed above. The superconducting generator may be configured, for example, as a superconducting wind turbine generator.

The present invention encompasses a wind turbine power generating system that includes a tower; a hub, and a plurality of blades connected to the hub; a rotor connected to the hub; and a superconducting generator coupled to the rotor. The superconducting generator may be configured in accordance with any combination of the embodiments of the quench protection system and generator discussed above.

The present invention also encompasses various methodologies for operating a superconducting generator, in particular a superconducting wind turbine generator, in accordance with the aspects discussed above.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

The present disclosure encompasses any manner of superconducting machine, and is not limited to superconducting generators. For sake of explanation, the present quench protection system is described herein with reference to a superconducting generator in general, and more particularly to a wind turbine superconducting generator.

Figure 1:
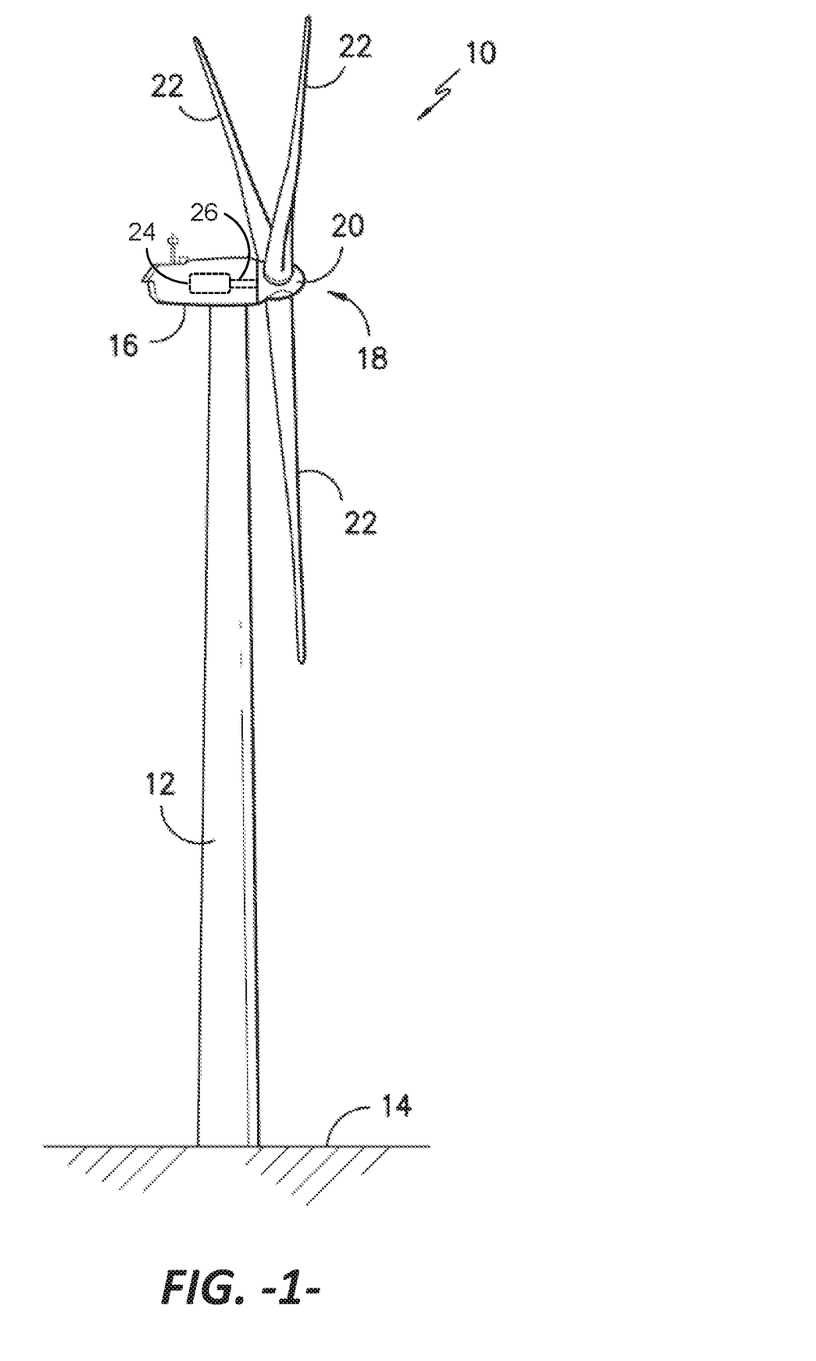
FIG. 1 illustrates a perspective view of an embodiment of a wind turbine with a superconducting generator according to the present disclosure.

Referring now to the drawings, FIG. 1 illustrates a perspective view of one embodiment of a wind turbine power generating system 10. As shown, the wind turbine 10 generally includes a tower 12 extending from a support surface 14, a nacelle 16 mounted on the tower 12, and a rotor 18 coupled to the nacelle 16. The rotor 18 includes a rotatable hub 20 and at least one rotor blade 22 (three are shown) coupled to and extending outwardly from the hub 20. Each rotor blade 22 may be spaced about the hub 20 to facilitate rotating the rotor 18 to enable kinetic energy to be transferred from the wind into usable mechanical energy, and subsequently, electrical energy. For this purpose, the rotor 18 is coupled to a generator 24 via a shaft 26. For purposes of the present disclosure, the generator 24 is a direct drive superconducting generator.

The present invention encompasses a wind turbine power generating system 10, as described above, wherein the generator 24 is configured as a superconducting generator with a quench protection system as set forth below.

The present invention also encompasses various methodologies of operating a superconducting generator, in particular a wind turbine superconducting generator, with a quench protection system in accordance with method aspects set forth below.

Figure 2:
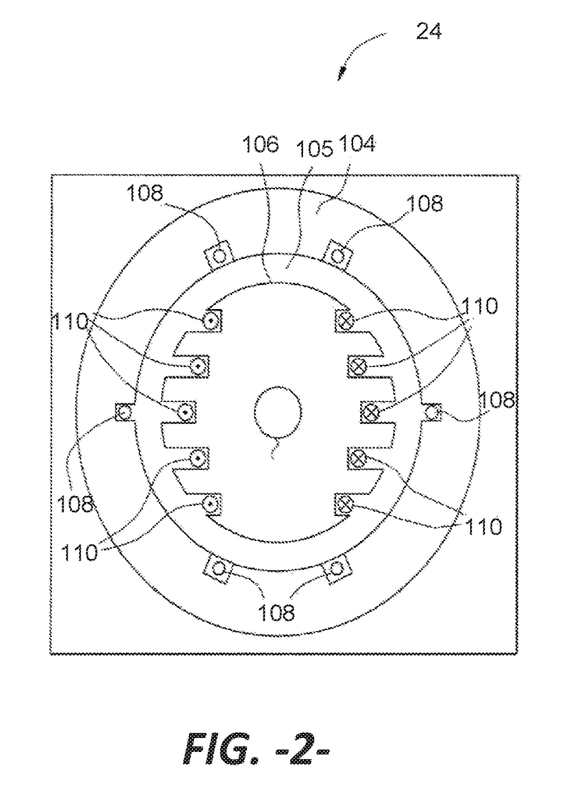
FIG. 2 is a cross-sectional view of a superconducting generator.

FIG. 2 illustrates an exemplary cross sectional view of the superconducting generator 24 from FIG. 1. As depicted, the generator 24 includes an outer concentric component 104, which may be the stator, and an inner concentric component 106, which may be the rotor (e.g., in an internal rotor configuration) However, in other embodiments, the outer component 104 may be a rotor of the generator 24, and the inner component 106 may be a stator of the generator 24 (e.g., in an external rotor configuration). A gap (or "air gap") 105 is defined between the outer component 104 and inner component 106 and allows movement (e.g., rotation) therebetween.

The generator 24 also includes a first set of one or more current carrying conductors ("coils") 108 attached to the outer component 104 and a second set of one or more current carrying conductors ("coils") 110 attached to the inner component 106. During operation of the generator 24, these coils 108, 110 are in electromagnetic communication. The coils 108 may be armature coils, and coils 110 may be field coils of the generator 24. In other embodiments, the coils 108 may be field coils and the coils 110 may be armature coils of the generator 24. The field coils are connected to a source of excitation current (e.g., an "exciter"), wherein current flow therethrough produces a magnetic field across the field coil, and the armature coil is connected to the output of the generator 24 (e.g., via output terminals) to conduct an output current and electrical power output. Although several coils 108, 110 are depicted, there may be more or less coils 108, 110 and/or windings thereof about the outer component 106 and inner component 108 in various embodiments, e.g., to configure the number of poles of the generator 24 and, thereby, the generating frequency and/or other operating characteristics of the generator 24.

The field coils, e.g., coils 110, are constructed of a superconducting material, such as niobium-titanium (NbTi), niobium-tin (Nb3Sn), or magnesium-boron (MgB2). Typically, the armature coils 108 are constructed from copper. However, in certain embodiments, the armature coils may be constructed of a superconducting material, such as NbTi, Nb3Sn, or MgB2. In certain embodiments, the superconducting material may also be a high temperature superconductor, such as YBCO or ReBCO.

Figure 3:
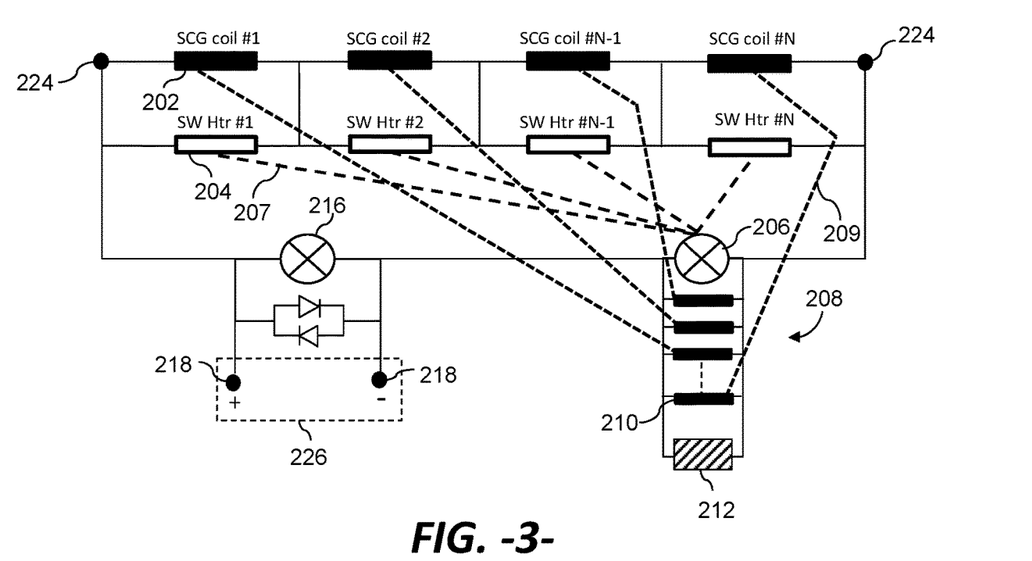
FIG. 3 is a diagram view of a quench protection system for a superconducting machine in accordance with aspects of the invention.

FIG. 3 is a diagram of an embodiment of a quench protection system 200 in accordance with aspects of the present disclosure. The system 200 may be incorporated with a superconducting machine, such as an MRI machine or a superconducting generator (e.g. a superconducting wind turbine generator). A superconducting magnet includes a plurality of coils 202 depicted as SCG coil #1 through SCG coil #N connected in series. Each of these coils 202 has a corresponding switch heater 204 (labeled SW Htr #1 through SW Htr #N) electrically coupled therewith, for example in a parallel configuration therewith.

Circuit includes leads 218 are provided for connection with a main power supply 226, wherein the leads 218 may be fixed or retractable. When connected to the main power supply 226, the superconductive coils 202 are supplied with a current via ends 224 of the series-arranged coils 202.

A superconductive main switch 216 is configured in the system 200 in parallel with the coils 202. As known in the art, this switch 206 may be, for example, a ramping-switch with a non-inductive superconductive wire portion and a heater portion impregnated in an epoxy. As understood in the art, a superconductive switch is, by definition, non-inductive. The wire portion is configured such that in-flow and out-flow of current fully cancel each other magnetically and the switch shows no inductance. By controlling the heater portion, the wire portion can be switched between a resistive state and a superconductive state. This type of switch 206 is typically used to transfer the superconducting coils between a superconducting persistent operating mode and a non-persistent superconducting mode. Generally, the switch 206 is used to "ramp-up" the coils 202 to the persistent mode and to purposefully "ramp-down" the coils from the persistent mode. When the system 200 is connected to a current source (power supply 226) via the leads 218, current flows through the coils 202 and the main switch 216. When the magnet/coils 202 are ramped-up to the required current, the main switch 216 becomes superconductive and is closed. As the power supply connected to the leads 218 is ramped down, the current through the main switch 216 increases by essentially the same amount as the decrease in the external power supply current. Once the external power supply is ramped down completely, the leads 218 are disconnected from the external power supply. At this point, the superconductive coils 202 are in the persistent operating mode.

The system 200 includes a superconductive quench protection switch (QPS) 206 configured in series with the coils 202 and main switch 216. This QPS switch 206 may be the same type of switch as the main switch 216 discussed above. The main switch 216 needs a relatively long length of superconductor to provide a few ohms of resistance when it is resistive so that the joule heating on the main switch during ramp is manageable (not too high). The QPS switch 206 is generally similar in size or smaller in size as the main switch 216 with similar superconducting characteristics.

In the persistent operating mode, the QPS 206 is also superconductive, and thus closed. Each of the switch heaters 204 are in thermal contact with the QPS 206, as indicated by the first set of dashed lines 207, for example by being glued or otherwise fixed directly onto the surface of the QPS 206.

When one of the coils 202 quenches, a voltage rapidly develops across that coil 202, and so also across the associated switch heater 204 electrically coupled thereto, causing a current to flow through the switch heater 204. The switch heater 204 is in thermal contact with the QPS 206 and will thus cause the QPS 206 to quench.

A heater network 208 is configured in parallel with the QPS 206 and is in thermal contact with each of the coils 202, as indicated by the second set of dashed lines 209. With this unique configuration, a quench of any one of the coils 202 also triggers a quench of the QPS 206. The resulting voltage induced across the QPS 206 triggers the heater network 208 (causing current flow through individual heaters 210 in the network 208). This activation of the heater network 208 thus results in the subsequent, rapid quenching of all of the remaining coils 202.

An additional particular advantage of the system 200 is that, due to placement of the QPS 206 in series with the coils 202 and main switch 216, quench protection is provided during ramp-up to persistent mode, as well as during persistent mode of operation.

The heater network 208 may have various configurations of individual heaters 210, wherein each coil 202 is in thermal contact with at least one of the heaters 210. For example, in the embodiment of FIG. 3, the N heaters 210 are configured in parallel within the heater network 208, wherein there is an individual heater 210 associated with each coil 202.

Figure 4:
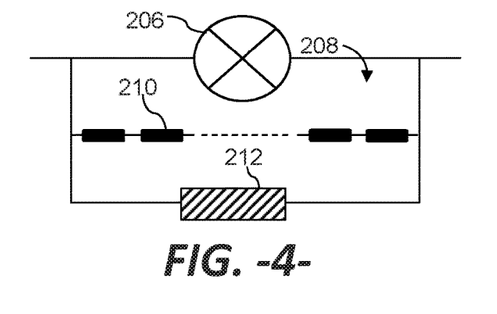
FIG. 4 is a diagram view of an embodiment of a heater network for use in the quench protection system of FIG. 3.

In another embodiment depicted in FIG. 4, the heater network 208 includes N heaters 210 connected in series, wherein there is an individual heater 210 associated with each coil 202.

Figure 5:
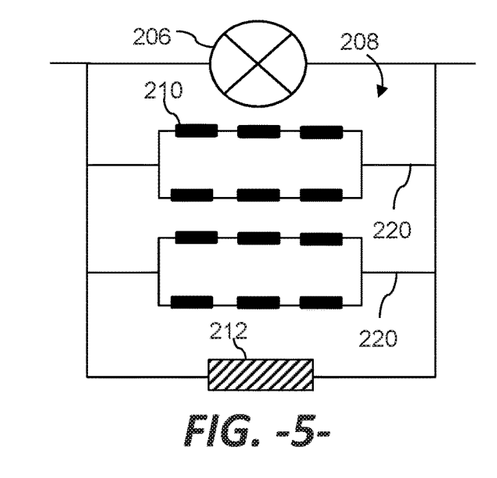
FIG. 5 is a diagram view of an alternate embodiment of a heater network.

In another embodiment, the heater network 208 may include heaters 210 configured in parallel and series. For example in the embodiment of FIG. 5, a first branch 220 in the heater network 208 includes a plurality of heaters 210 in series within separate lines, with the lines in parallel. The first branch 220 is in parallel with a similarly configured second branch 222.

Figure 6:
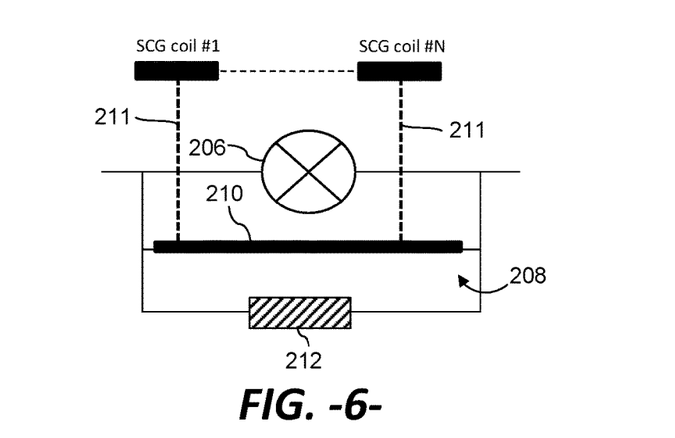
FIG. 6 is a diagram view of another embodiment of a heater network.

FIG. 6 depicts an embodiment of the heater network 208 that has a single heater 210, wherein each of the coils 202 is in thermal contact with the single heater 210, as indicated by the dashed lines 211.

As depicted for example in the embodiment of the system 200 in FIG. 3, a voltage clamp device 212, such as a diode configuration or shunt resistor, may be arranged across the heater network to limit the voltage applied across the heaters.

Figure 7:
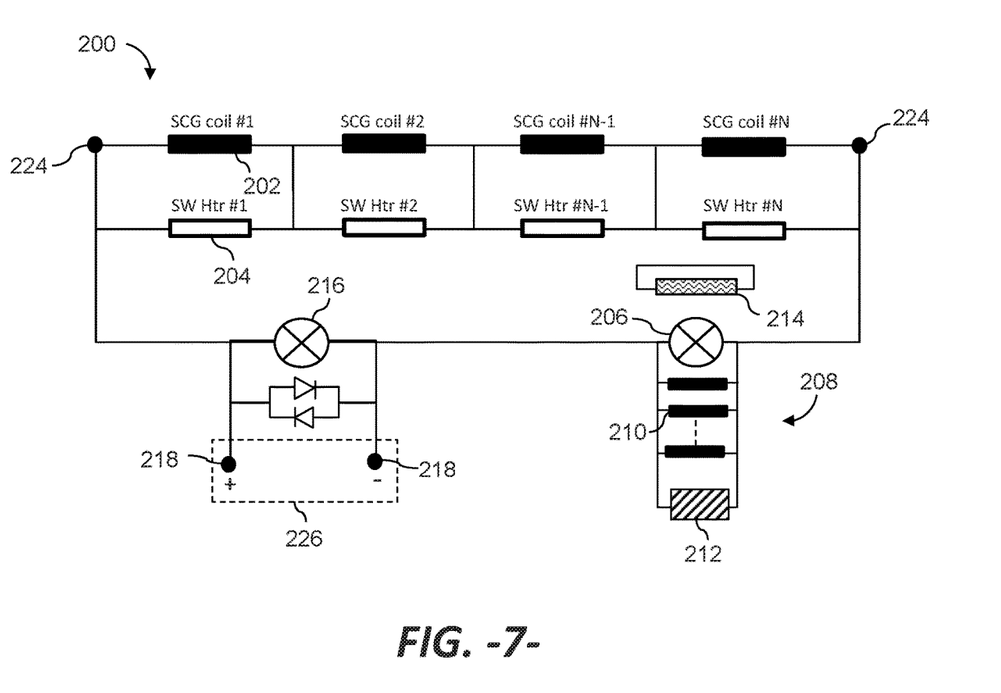
FIG. 7 is a diagram view of an alternate embodiment of a quench protection system.

It may be desired to locate the QPS 206 in the high magnetic field (e.g., around 2-4 T field region) relatively close to the superconducting field coils 202 in a generator to further enhance the quench propagation speed in all of the coils 202. In this case, FIG. 7 depicts an embodiment of the quench protection system 200 with the addition of a shielding coil 214 that shields the QPS 206 from the high field strength (e.g. to less than about 0.5 T). The shielding coil 214 is self-shorted (not connected into the main current power supply circuit). Each of the superconducting field coils 202 has a shielding coil heater (not illustrated) electrically coupled therewith and in thermal communication with the shielding coil 214. The shielding coil 214 quenches similar to the QPS switch 206. Once any one of the coils 202 quenches, the QPS 206 and the shielding coil 214 will quench. When the coil 214 quenches, the QPS 206 will be exposed to the high field strength and quench spontaneously, which results in an accelerated triggering of the heater network 208 and subsequently quenching of the remaining coils 202.

The embodiments described herein provide a quench protection system 200 that is relatively simple, reliable, and cost-efficient. Instead of an (N×N) switch heater matrix as used in conventional quench protections systems, the present system can be implemented with about a 2×N heater matrix (e.g., FIG. 6) or 3×N heater matrix (e.g., FIG. 7), a QPS, and a voltage clamping device if needed. The quench protection system provides protection during ramp-up as well as in persistent mode, as discussed above.

Various aspects and embodiments of the present invention are defined by the following numbered clauses:

1. A quench protection system for a superconducting machine having a plurality of superconducting coils arranged in series, comprising:
   at least one switch heater electrically coupled across each of the superconducting coils;
   a quench protection switch configured in series with the superconducting coils, each of the switch heaters in thermal contact with the quench protection switch;
   a heater network configured in parallel with the quench protection switch, the heater network in thermal contact with each of the coils;
   such that a quench of any one of the superconducting coils activates the switch heater coupled therewith and the activated switch heater triggers a quench of the quench protection switch; and
   wherein the quench of the quench protection switch activates the heater network to trigger a quench of all remaining superconducting coils.

2. The quench protection system as in clause 1, wherein the heater network comprises a plurality of heaters connected in parallel, with each superconducting coil in thermal contact with at least one of the heaters.

3. The quench protection system as in any preceding clause, wherein the heater network comprises a plurality of heaters connected in series, with each superconducting coil in thermal contact with at least one of the heaters.

4. The quench protection system as in any preceding clause, wherein the heater network comprises a plurality of heaters connected in parallel and a plurality of heaters connected in series, with each superconducting coil in thermal contact with at least one of the heaters.

5. The quench protection system as in any preceding clause, wherein the heater network comprises a single heater, with each superconducting coil in thermal contact with the single heater.

6. The quench protection system as in any preceding clause, further comprising a voltage clamp device across the heater network.

7. The quench protection system as in any preceding clause, further comprising a shielding coil applied to the quench protection switch to accelerate quenching of the heater network.

8. A superconducting generator, comprising:
   a plurality of superconducting field coils arranged in series;
   a quench protection system, the quench protection system further comprising:
   at least one switch heater electrically coupled across each of the superconducting coils;
   a quench protection switch configured in series with the superconducting coils, each of the switch heaters in thermal contact with the quench protection switch;
   a heater network configured in parallel with the quench protection switch, the heater network in thermal contact with each of the coils;
   such that a quench of any one of the superconducting coils activates the switch heater coupled therewith and the activated switch heater triggers a quench of the quench protection switch; and
   wherein the quench of the quench protection switch activates the heater network to trigger a quench of all remaining superconducting coils.

9. The superconducting generator as in clause 8, wherein the heater network comprises a plurality of heaters connected in parallel, with each superconducting coil in thermal contact with at least one of the heaters.

10. The superconducting generator as in any one of clauses 8-9, wherein the heater network comprises a plurality of heaters connected in series, with each superconducting coil in thermal contact with at least one of the heaters.

11. The superconducting generator as in any one of clauses 8-10, wherein the heater network comprises a plurality of heaters connected in parallel and a plurality of heaters connected in series, with each superconducting coil in thermal contact with at least one of the heaters.

12. The superconducting generator as in any one of clauses 8-11, wherein the heater network comprises a single heater, with each superconducting coil in thermal contact with the single heater.

13. The superconducting generator as in any one of clauses 8-12, further comprising a voltage clamp device across the heater network.

14. The superconducting generator as in any one of clauses 8-13, further comprising a shielding coil applied to the quench protection switch to accelerate quenching of the heater network.

15. The superconducting generator as in any one of clauses 8-14, wherein the superconducting generator is a wind turbine generator.

16. A wind turbine power generating system, comprising a superconducting generator as in any one of clauses 8-14.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A quench protection system for a superconducting machine having a plurality of superconducting coils arranged in series, comprising:
   at least one switch heater electrically coupled across each of the superconducting coils;
   a quench protection switch configured in series with the superconducting coils, each of the switch heaters in thermal contact with the quench protection switch, the quench protection switch comprising a non-inductive superconductive switch with a superconductive wire portion and a heater portion wherein the wire portion is switched between a resistive state and a superconductive state by controlling the heater portion;
   a heater network configured in parallel with the quench protection switch, the heater network in thermal contact with each of the coils;
   such that a quench of any one of the superconducting coils activates the switch heater coupled therewith and the activated switch heater triggers a quench of the quench protection switch; and
   wherein the quench of the quench protection switch activates the heater network to trigger a quench of all remaining superconducting coils.

2. The quench protection system as in claim 1, wherein the heater network comprises a plurality of heaters connected in parallel, with each superconducting coil in thermal contact with at least one of the heaters.

3. The quench protection system as in claim 1, wherein the heater network comprises a plurality of heaters connected in series, with each superconducting coil in thermal contact with at least one of the heaters.

4. The quench protection system as in claim 1, wherein the heater network comprises a plurality of heaters connected in parallel and a plurality of heaters connected in series, with each superconducting coil in thermal contact with at least one of the heaters.

5. The quench protection system as in claim 1, wherein the heater network comprises a single heater, with each superconducting coil in thermal contact with the single heater.

6. The quench protection system as in claim 1, further comprising a voltage clamp device across the heater network.

7. The quench protection system as in claim 1, further comprising a shielding coil applied to the quench protection switch to accelerate quenching of the heater network.

8. A superconducting generator, comprising:
a plurality of superconducting field coils arranged in series;
a quench protection system, the quench protection system further comprising:
at least one switch heater electrically coupled across each of the field coils;
a quench protection switch configured in series with the superconducting coils, each of the switch heaters in thermal contact with the quench protection switch, the quench protection switch comprising a non-inductive superconductive switch with a superconductive wire portion and a heater portion wherein the wire portion is switched between a resistive state and a superconductive state by controlling the heater portion;
a heater network configured in parallel with the quench protection switch, the heater network in thermal contact with each of the coils;
such that a quench of any one of the superconducting coils activates the switch heater coupled therewith and the activated switch heater triggers a quench of the quench protection switch; and
wherein the quench of the quench protection switch activates the heater network to trigger a quench of all remaining superconducting coils.

9. The superconducting generator as in claim 8, wherein the heater network comprises a plurality of heaters connected in parallel, with each superconducting coil in thermal contact with at least one of the heaters.

10. The superconducting generator as in claim 8, wherein the heater network comprises a plurality of heaters connected in series, with each superconducting coil in thermal contact with at least one of the heaters.

11. The superconducting generator as in claim 8, wherein the heater network comprises a plurality of heaters connected in parallel and a plurality of heaters connected in series, with each superconducting coil in thermal contact with at least one of the heaters.

12. The superconducting generator as in claim 8, wherein the heater network comprises a single heater, with each superconducting coil in thermal contact with the single heater.

13. The superconducting generator as in claim 8, further comprising a voltage clamp device across the heater network.

14. The superconducting generator as in claim 8, further comprising a shielding coil applied to the quench protection switch to accelerate quenching of the heater network.

15. The superconducting generator as in claim 8, wherein the superconducting generator is a wind turbine generator.

16. A wind turbine power generating system, comprising:
a tower;
a hub, and a plurality of blades connected to the hub;
a rotor connected to the hub;
a superconducting generator coupled to the rotor, the superconducting generator further comprising:
a plurality of superconducting field coils arranged in series;
a quench protection system, the quench protection system further comprising:
at least one switch heater electrically coupled across each of the field coils;
a quench protection switch configured in series with the superconducting coils, each of the switch heaters in thermal contact with the quench protection switch, the quench protection switch comprising a non-inductive superconductive switch with a superconductive wire portion and a heater portion wherein the wire portion is switched between a resistive state and a superconductive state by controlling the heater portion;
a heater network configured in parallel with the quench protection switch, the heater network in thermal contact with each of the coils;
such that a quench of any one of the superconducting coils activates the switch heater coupled therewith and the activated switch heater triggers a quench of the quench protection switch; and
wherein the quench of the quench protection switch activates the heater network to trigger a quench of all remaining superconducting coils.

* * * * *